March 8, 1966 T. P. KAUFMAN 3,239,773

WIDE-BAND CASCODE VHF AMPLIFIER UTILIZING INHERENT TRANSISTOR REACTANCE

Filed Aug. 5, 1963

INVENTOR.
THEODORE P. KAUFMAN
BY Moody and Antrim
AGENTS

United States Patent Office 3,239,773

Patented Mar. 8, 1966

3,239,773

WIDE-BAND CASCODE VHF AMPLIFIER UTILIZING INHERENT TRANSISTOR REACTANCE

Theodore P. Kaufman, Plano, Tex., assignor to Collins Radio Company, Cedar Rapids, Iowa, a corporation of Iowa Filed Aug. 5, 1963, Ser. No. 299,752
3 Claims. (Cl. 330—18)

This invention pertains to wide-band high-frequency transistor amplifiers and particularly to cascode amplifiers in which the reactances of the transistors are part of broadly tuned circuits.

In cascode amplifiers, either two radio tubes or two transistors have their output current paths connected in series to provide control of current by an input signal relatively independent of changes across the output load. A cascode amplifier stage has been found to be advantageous for greater gain and greater signal-to-noise ratio than those obtainable from a stage that utilizes a single tube or a single transistor. Also, in transistor amplifiers where isolation is inherently difficult to obtain, the cascode arrangement improves the isolation between input and output circuits.

According to the present invention, a cascode amplifier provides moderate gain with low noise over a frequency range that is wider than the frequency range of prior transistor amplifiers. To obtain this wider frequency range, the internal circuits of the transistors are resonated with certain external circuit components. The base of one transistor is connected to the input for the incoming signal, and the emitter of this transistor is resonated by a capacitive and resistive network. A series capacitor and resistor connected between the emitter of this transistor and the base of the other series transistor functions both to resonate the circuit to which it is connected and to couple signal energy from the emitter circuit of the former transistor to the base of the latter transistor. The coupling arrangement, with values chosen for resonance at the higher range of frequencies of the desired band, extends the range of frequencies over which the stage operates with substantially equal gain.

An object of the present invention is to extend the range of frequency of operation of a low-noise transistor amplifier stage.

Figure 1:
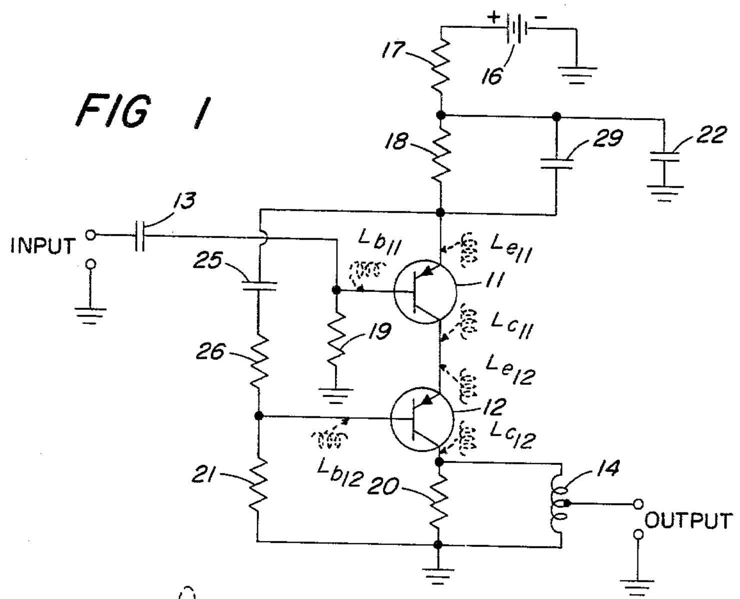

The cascode amplifier in FIG. 1 includes transistors 11 and 12 that have their emitter-collector circuits connected in series. The signal input is coupled through a capacitor 13 to the base of the transistor 11. The output circuit is connected to the collector of the transistor 12 through the tapped toroidal coil 14. The resistors that are in the series emitter-collector circuits perform the usual function of providing the load impedances and the required direct-current operating voltages for the transistors, but in addition in this circuit, the values of the resistors are selected to provide desired circuit Q in the resonate circuits that compensate for the internal inductance of the transistors and the interconnecting wiring.

The direct-current emitter-collector circuit includes a source of direct current 16 that has its positive terminal connected through series resistors 17 and 18 to the emitter of the transistor 11. The base of transistor 11 is connected through a resistor 19 to ground to which is connected the negative terminal of the source 16. The resistance of the resistor 19 is selected to provide the required bias between the base and the emitter of the transistor 11 to operate it as an amplifier. The direct-current circuit for the emitter collector circuit of transistor 11 is completed through the emitter-collector circuit of transistor 12, the winding of the toroidal coil 14 and its parallel resistor 20, and through a grounded conductor to the negative terminal of the source 16. The base of the transistor 12 is connected through a bias resistor 21 to ground. The value of the resistor 21 is selected in conjunction with the value of the resistor 19 so that the desired emitter-collector current is obtained through the transistors 11 and 12.

Although the inductive characteristics of the transistor circuits cannot be isolated to specific portions of the interconnected circuit components and elements, for easier understanding, the following explanation of the gain characteristics specifies particular inductive circuits with which the capacitors and associated resistors are most closely connected to provide the gain characteristics that are described.

Figure 2A:
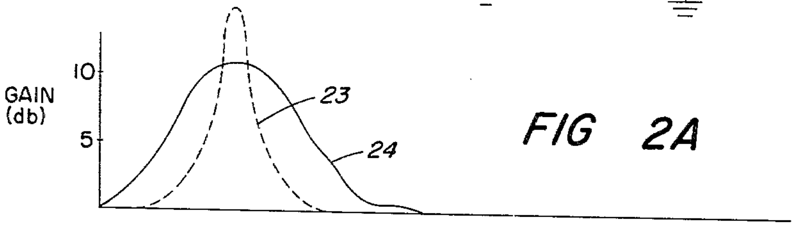

When transistors are employed in high frequency applications the lead inductances of transistors becomes appreciable. Lead inductance is attributed to the finite lead strength from external circuit connection up through the transistor header and additionally, to the length of finewhisker wire used in making internal connections from header to the transistor structure. These inductances which will here be referenced as as internal emitter, collector and base inductances, are taken into consideration in the present invention and actually resonated at certain frequencies within the desired passband by the addition of external capacitor elements. The internal emitter, collector and base inductances of the transistor 11 are indicated in phantom in the configuration of FIGURE 1 as $L_{e11}$, $L_{c11}$, and $L_{b11}$, respectively. The internal emitter, collector and base inductances of the transistor 12 are similarly represented and identified as $L_{e12}$, $L_{c12}$, and $L_{b12}$, respectively. These inductances represent a finite inductance in the current path with which they are associated. To accentuate the low-frequency response within the range of desired frequencies over which the circuit is to operate, a capacitor 22 is connected between the junction of the resistors 17 and 18 to resonate the series emitter-collector circuit of transistors 11 and 12 which includes the internal emitter and collector inductances $L_{e11}$, $L_{c11}$, $L_{e12}$ and $L_{c12}$ of transistors 11 and 12 respectively. The Q circuit characteristic of the low-frequency portion of the response is largely determined by the values of the resistors 17 and 18. When resistor 18 is not included in the circuit and the resonant circuits described below have not yet been added, the response curve at the low frequency end of the final over-all range appears as shown by the dashed curve 23 of FIG. 2A. When the resistor 18 is added, the Q of the circuit is decreased so that the peak gain over a narrow range is less and moderate gain is spread over a wider range of frequencies as shown in curve 24.

Figure 2B:
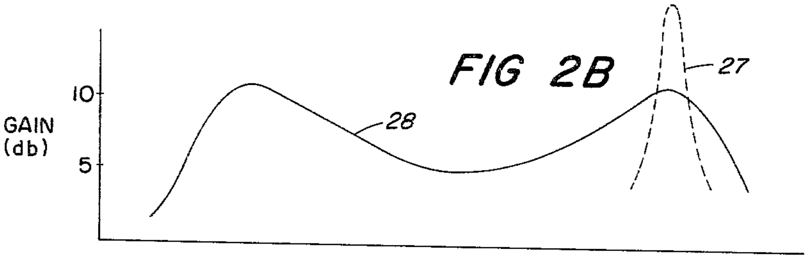

The high frequency portion of the desired range is very effectively accentuated by the addition of a capacitor 25 and a resistor 26 connected in series between the emitter of the transistor 11 and the base of the transistor 12. Apparently, the capacitor 25 contributes in two ways to the high frequency response. The capacitor in conjunction with the inductive circuit between the emitter of the transistor 11 and the base of the transistor 12, which includes the base inductance $L_{b_{12}}$ of transistor 12, the emiter inductance $L_{e_{12}}$ of transistor 12 and the collector and emitter inductances $L_{c_{11}}$ and $L_{e_{11}}$ of transistor 11, resonates at a point near the high end of the desired frequency range of operation. It also operates as a coupling capacitor to couple signal energy from the emitter of the transistor 11 to the control element or base of the transistor 12. When the resistor 26 is not included and the capacitor 25 is connected directly, the response curve over the high frequency portion of the range is according to the dashed curve 27 of FIG. 2B. When the resistor 26 of selected value is connected in series with the capacitor 25, the response curve at the high frequency end of the range is broadened as shown in the right portion of the response curve 28. The curve 28 is a combination of the curve 24 for the low frequency response and the brordened curve for the high frequency response.

In order to accentuate the middle range of frequencies so that the response curve shows a gain over the middle range of frequencies that is about the same as the gain at the accentuated high and low frequency portions, capacitor 29 of the required value is connected in parallel with the resistor 18 that is connected to the emitter of the transistor 11 to resonate the internal inductances $L_{e_{11}}$ and $L_{c_{11}}$ of transistor 11 along with the internal inductances $L_{e_{12}}$ and $L_{c_{12}}$ of transistor 12. The required Q characteristic of the circuit over the middle range is mostly determined by the value of the resistor 18. As observed above, the Q characteristic over the low range of frequencies is determined by the combined values of both series resistors 17 and 18. Since the value of resistor 18 has more effect over the middle range of frequencies than the value of resistor 17, the resistors 17 and 18 may be selected to have a ratio of values that provides substantially flat gain of the amplifier over the desired wide range.

Figure 2C:
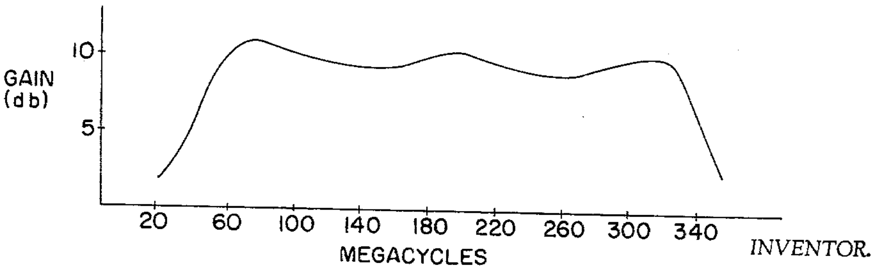

The component parts of the circuit of FIG. 1 have the following values to provide the gain response curve shown in FIG. 2C. According to this curve, the gain of the amplifier is approximately 10 db (decibels) over a frequency range of approximately 60 megacycles to well over 300 megacycles.

| | | |
|---|---|---|
| PNP transistors **11** and **12** | | Type 2N1142 |
| Resistor **17** | ohms | 680 |
| Resistor **18** | do | 12 |
| Resistor **19** | do | 82,000 |
| Resistor **20** | do | 270 |
| Resistor **21** | do | 33,000 |
| Resistor **26** | do | 47 |
| Capacitor **13** | micromicrofarads | 82 |
| Capacitor **22** | do | 220 |
| Capacitor **25** | do | 12 |
| Capacitor **29** | do | 33 |

Although this invention has been described with respect to a particular embodiment thereof, it is not to be so limited, as charges and modifications may be made therein which are within the spirit and scope of the invention as defined by the appended claims.

What is claimed is:

1. A wide-band cascode amplifier comprising first and second amplifying devices, each of said amplifying devices having first and second electrodes and a control electrode, said control electrodes being responsive to signal voltages to control the current flow between said respective first and second electrodes, a source of direct-current voltage, a signal input terminal connected to the control electrode of said first amplifying device, a capacitive and resistive network connected between one terminal of said source and said first electrode of said first amplifying device, said network being resonant with the inherent inductances of said first electrodes of said first amplifying device to provide gain at desired frequencies of signal applied to said input, said network also conducting operating voltages from said source to said amplifying devices, the second electrode of said first amplifying device being connected to the first electrode of said second amplifying device for connecting said first and second electrodes of said amplifying devices in series, an impedances device connected between said second electrode of said second amplifying device and the other terminal of said source, an output terminal connected to said impedance device, a capacitor and a resistor connected in series directly between the first electrode of said first amplifying device and the control electrode of said second amplifying device and externally to said first and second amplifying devices, said capacitor and said resistor resonating the inherent inductances of said electrode circuits to which they are connected and coupling signal energy from said first electrode of said first amplifying device to the control electrode of said second amplifying device to provide substantial gain of said cascode amplifier over a range of signal that has higher frequencies than could be realized without the connection of said resistor and said capacitor.

2. A wide-band cascode amplifier comprising first and second transistors, each of said transistors having an emitter, a base, and a collector, the emitter collector circuits of said transistors being connected in series, the collector of said first transistor being connected to the emitter of said second transistor, a source of direct-current voltage, a first impedance means connected between the emitter of said first transistor and a first terminal of said source and in circuit with the inherent emitter and collector inductances of said first and second transistors being resonate at a first frequency, an output impedance means connected between said collector of said second transistor and the second terminal of said source, biasing means including a resistance member connected from the base electrode of each of said transistors to said second terminal of said source to bias said transistors to operate as amplifiers, a signal input connected to the base of said first transistor, and a resistor and capacitor connected in a series directly between said emitter of said first transistor and the base of said second transistor and externally of said first and second transistors, said capacitor functioning as a coupling capacitor and in addition having the value required for resonating the circuits to which it is connected including the inherent base and emitter inductances of said second transistor and the inherent collector and emitter inductances of said first transistor to accentuate signal over a wide frequency range including higher frequencies than those obtainable through use of said first impedance means alone.

3. A wide-band transistor amplifier comprising first and second transistors, each of said transistors having an emitter, a base, and a collector, the emitter-collector circuits of said transistors being connected in series, the collector of said first transistor being connected to the emitter of said second transistor, a source of direct-current voltage, first and second series resistors, said second series resistor being connected to the emitter of said first transistor, an output load impedance circuit connected to the collector of said second transistor; said source, said series resistors, the emitter-collector circuits of both of said transistors and said output load impedance being connected in series; biasing means comprising resistive members connected from the base electrode of each of said transistors to a second terminal of said direct current voltage source for biasing the respective transistors for amplification; means for applying input signal to the base of said first transistor; a first capacitor connected in parallel with said first series resistor to resonate with the series emitter-collector circuits of said first and second transistors including the inherent emitter and collector inductances of said first and second transistors for providing gain over the mid range of frequencies of said input signal, a second capacitor connected at the junction of said first and second resistors so as to be connected parallel with a portion of said series circuit including said second resistor and said emitter-collector circuits of said transistors for providing gain at the low range of frequencies of said input signal, a fourth resistor and a third capacitor connected in series between the emitter of said first transistor and the base of said second transistor to function as a coupling circuit and to resonate with the inherent inductances of said first and second transistors for providing gain at the high range of frequencies of said input signal so that said amplifier has substantially flat gain characteristics over a wide frequency range.

References Cited by the Examiner

UNITED STATES PATENTS

| | | | |
|---|---|---|---|
| 2,926,307 | 2/1960 | Ehret | 330—18 |
| 3,177,439 | 4/1965 | Tulp et al. | 330—18 |
| 3,181,079 | 4/1965 | Bregman | 330—18 |

FOREIGN PATENTS

| | | |
|---|---|---|
| 813,944 | 5/1959 | Great Britain. |

ROY LAKE, *Primary Examiner.*

F. D. PARIS, *Assistant Examiner.*